United States Patent [19]

Marik et al.

[11] Patent Number: 5,647,613
[45] Date of Patent: Jul. 15, 1997

[54] CONNECTOR FOR RETENTIVELY TERMINATING ELECTRICAL CONDUIT

[75] Inventors: Greg Marik, Germantown; Jessica Henderson; Larry Cole, both of Memphis, all of Tenn.

[73] Assignee: Thomas & Betts Corporation, Memphis, Tenn.

[21] Appl. No.: 515,478

[22] Filed: Aug. 15, 1995

[51] Int. Cl.[6] .............................. H05K 5/02; F16V 21/00
[52] U.S. Cl. ...................... 285/195; 285/154.3; 174/65 R
[58] Field of Search ................................... 285/195, 128, 285/129; 174/64, 65 R

[56] References Cited

U.S. PATENT DOCUMENTS

| Re. 18,773 | 3/1933 | Thomas, Jr. . | |
| D. 336,282 | 6/1993 | Guginsky | D13/133 |
| D. 339,792 | 9/1993 | Nardi et al. | D13/149 |
| D. 339,793 | 9/1993 | Nardi et al. | D13/149 |
| D. 360,188 | 7/1995 | Kiely et al. | D13/152 |
| 1,418,990 | 6/1922 | Thomas, Jr. . | |
| 1,475,524 | 11/1923 | Thomas, Jr. . | |
| 1,611,499 | 12/1926 | Vaughn et al. | 285/129 |
| 1,644,313 | 10/1927 | Thomas, Jr. | 285/195 |
| 1,711,912 | 5/1929 | Vaughn et al. | 285/129 |
| 1,760,663 | 5/1930 | Rosenfield | 285/129 |
| 1,770,116 | 7/1930 | Thomas, Jr. | 285/195 |
| 1,787,774 | 1/1931 | Briegel . | |
| 1,793,884 | 2/1931 | Churin | 285/195 |
| 1,793,886 | 2/1931 | Weber . | |
| 1,816,669 | 7/1931 | Church | 285/195 |
| 2,086,710 | 7/1937 | Fotsch | 173/263 |
| 2,093,038 | 9/1937 | Douglas | 248/27 |
| 2,260,806 | 10/1941 | Hinchman | 285/195 |
| 2,485,364 | 10/1949 | Deakin | 173/328 |
| 2,490,253 | 12/1949 | Buchanan | 174/65 R |
| 2,490,286 | 12/1949 | Tornblom | 285/6.5 |
| 2,508,476 | 5/1950 | Stecher | 285/6.5 |
| 2,643,136 | 6/1953 | Schesser | 285/6.5 |
| 2,973,212 | 2/1961 | Rose | 285/195 |
| 3,006,981 | 10/1961 | Weber | 174/65 |
| 3,052,748 | 9/1962 | Curtiss | 174/65 R |
| 3,147,776 | 9/1964 | Hofmann | 139/114 |
| 3,174,776 | 3/1965 | Berger | 285/162 |
| 3,183,297 | 5/1965 | Curtiss | 174/65 |
| 3,544,705 | 12/1970 | Winston | 174/75 |
| 3,556,566 | 1/1971 | Bromberg | 285/162 |
| 3,774,008 | 11/1973 | Maniscalco | 219/401 |
| 3,836,941 | 9/1974 | Izraeli | 339/95 |
| 3,984,130 | 10/1976 | Berger et al. | 285/31 |
| 4,536,613 | 8/1985 | Gallas | 174/65 |
| 4,611,876 | 9/1986 | Barrabes | 339/263 |
| 4,619,332 | 10/1986 | Sheehan | 174/65 |
| 4,629,281 | 12/1986 | Kruger | 339/272 |
| 4,799,689 | 1/1989 | Nolf | 227/9 |
| 4,835,342 | 5/1989 | Guginsky | 174/65 |
| 4,929,198 | 5/1990 | Strate et al. | 439/709 |
| 5,047,795 | 9/1991 | Keable et al. | 354/320 |
| 5,165,735 | 11/1992 | Nardi et al. | 285/369 |
| 5,283,393 | 2/1994 | Guginsky | 174/102 |
| 5,324,994 | 6/1994 | Sullivan et al. | 307/351 |

FOREIGN PATENT DOCUMENTS 2457021  12/1980  France .

*Primary Examiner*—Eric K. Nicholson
*Attorney, Agent, or Firm*—Michael L. Hoelter; Salvatore J. Abbruzzese

[57] ABSTRACT

A conduit connector provides for the retentive termination of an electrical conduit to a junction box. The conduit connector includes the connector housing including a conduit receiving end, an opposed conductor egressing end and a central conduit passage therebetween. The housing includes opposed conduit engagement surfaces which are relatively movable towards one another to engage the conduit supported within the passage. Inwardly directed lances are struck from one of the opposed conduit engagement surfaces for biting engagement with the conduit to frictionally retain the conduit within the connector, resisting axial pullout of the conduit therefrom.

7 Claims, 2 Drawing Sheets

5,647,613

CONNECTOR FOR RETENTIVELY TERMINATING ELECTRICAL CONDUIT

FIELD OF THE INVENTION

The present invention relates generally to a conduit connector of the type which is attachable to an electrical junction box. More specifically, the present invention relates to a conduit connector which provides for the retentive termination of a conduit therein and which resists axial pullout of the conduit therefrom.

BACKGROUND OF THE INVENTION

In commercial and residential construction, electrical conductors which run between various locations are typically housed in an outer protective jacket. Such structures are referred to as electrical conduits. One such conduit is a flexible, metallic conduit where the conduit includes an outer helically convoluted metal jacket for enhanced flexibility. The conduit is terminated to an electrical junction or outlet box and the individual conductors are terminated to an electrical device supported in the junction box.

In order to suitably retain the conduit in the junction box, a conduit connector or fitting is employed to terminate the conduit and to mechanically and electrically support the conduit to the junction box itself. Conduit connectors of this type are well-known in the electrical connection art. These connectors typically include a cylindrical body which supports therein an end extent of the conduit. The cylindrical body is attachable to the junction box through a knock-out opening to allow passage of the conductors into the junction box. A screw may be interposed through the wall of the body to engage the conduit to securely retain the conduit within the body of the connector.

Also, in order to mechanically attach the connector to the outlet box within the opening, the cylindrical body of the connector may be of the split-shell type, where upon tightening of the screw against the conduit, the respective shells of the connector body open up slightly so as to engage the wall of the outlet box about the opening. U.S. Pat. Nos. 3,147,776 and 3,556,566 are examples of this type of conduit connector.

Improvements in such conduit connectors include the use of conduit engaging saddles attached to the end of the screw interposed through the body of the connector. The saddles are designed to engage the conduit to provide further retentive securement of the conduit within the connector body. Examples of the use of saddles in combination with conduit connectors are shown in U.S. Pat. Nos. 2,490,286 and 2,643,136.

While the saddles shown in these patents attempt to provide improved retention of the conduit within the connector body, these connectors of the prior art suffer from two distinct disadvantages.

First, the saddles themselves, while providing additional securement for the conduit within the connector body, fail to provide the axial pullout strength required in order to restrain the conduit from being easily pulled from the connector body once the connector is attached to the junction box. Additionally, as the saddles are attached to the end of the screw extending through the connector body, such attachment requires complicated manufacturing steps or modifications to the connector body in order to provide access to the end of the screw for attachment of the saddle thereto.

In above-referenced U.S. Pat. No. 2,643,136, access to the interior of the conduit connector must be provided so as to permit swaging of the tip of the screw so as to retain the saddle thereon. Further, in U.S. Pat. No. Des. 336,282 and Des. 360,188, the undersurface of the connector must be provided with an access opening to enable a tool to be inserted therein so that the saddle may be staked or connected to the end of the screw.

It is therefore desirable to provide a conduit connector which provides for increased axial pullout strength and which may be manufactured more simply and efficiently.

SUMMARY OF THE INVENTION

It is an object of the present invention to provide a conduit connector which securely retains an electrical conduit within the connector.

It is a further object of the present invention to provide a conduit connector attachable to an electrical junction box which supports a conduit therein, and which resists axial pullout of the conduit therefrom.

In the efficient attainment of these and other objects, the present invention provides a connection device for terminating an electrical conduit. The conduit includes a plurality of electrical conductors extending therethrough. The connection device includes an elongate connector housing having a conduit receiving end, an opposed conductor egressing end and a central conduit passage therebetween for supporting an end extent of the conduit. The conduit housing has opposed conduit engagement surfaces which are relatively movable towards one another to engage the conduit extent supported within the passage. Inwardly directed lances are struck from one of the conduit engagement surfaces for engagement with the conduit to frictionally retain the conduit extent within the housing.

As more particularly shown by way of the preferred embodiment herein, the conduit employed may be a flexible metallic conduit having an outer conduit wall including longitudinally spaced helical convolutions which enhance flexibility. The connector housing may include the lances arranged in spaced longitudinal succession such that upon attachment of the connection device to the end extent of the conduit, the spaced-apart lances reside within the spaced apart convolutions so that such engagement prevents axial pullout of the conduit from the connector housing.

Further, the connector may include a conduit engaging saddle movably supported therein. The saddle includes one of said conduit engagement surfaces for engagement with said conduit. The conduit engagement surface of the saddle may also include lances for engagement with the conduit.

DETAILED DESCRIPTION OF THE PREFERRED EMBODIMENT

Figure 1:
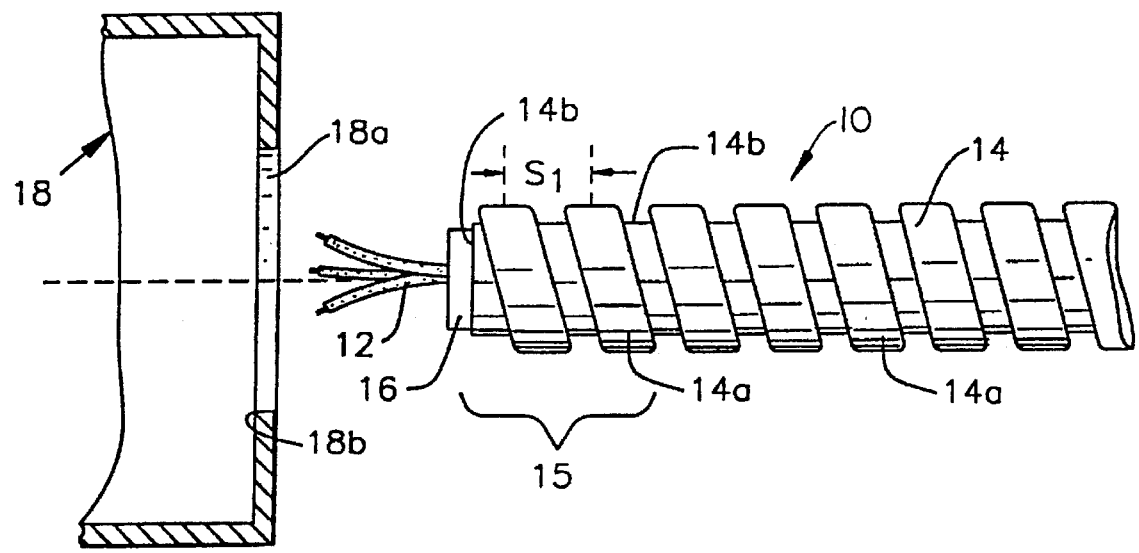
FIG. 1 shows an end portion of a flexible metallic conduit positioned for termination to an electrical junction box shown in partial section.

Referring to FIG. 1, a conventional electrical conduit 10 is shown. Conduits of the type known in the art typically include an outer tubular jacket which surrounds insulated electrical conductors. The outer jacket may be formed of a wide variety of materials including both insulative and conductive materials.

In the present illustrative embodiment, conduit 10 is a flexible metallic conduit including an outer metallic jacket 14 and plural insulated electrical conductors 12 extending therethrough. Outer jacket 14 includes successively longitudinally spaced helical convolutions 14a spaced apart a given distance $S_1$. The convolutions of outer jacket 14 provide for increased flexibility of conduit 10. In certain other conduit constructions, conduit 10 may include an inner intermediate jacket such as that shown at 16, formed of insulative material positioned between outer jacket 14 and conductors 12.

In typical residential or commercial construction, the conductors 12 of conduit 10 are terminated within an electrical junction box 18. A terminated end extent 15 of conduit 10 is inserted into box 18 through knockout opening 18a so that the conductors 12 may be terminated to an appropriate termination device such as an electrical receptacle (not shown) supported within junction box 18.

It is well-known in the electrical connection art to employ a conduit connector or fitting to securely retain the terminated end extent 15 of conduit 10 within junction box 18. Such conduit connectors are attachable to the junction box about the knock-out opening and support the end of the conduit thereat. The present invention provides an improved conduit connector 20, which is shown in FIGS. 2–5.

Connector 20 of the present invention includes an elongate connector body 22 which has a generally hollow cylindrical shape and includes a conduit receiving end 24 and an opposed conductor egressing end 26. Conduit body 22 defines a conduit receiving passage 28 between ends 24 and 26. The conductor egressing end 26 of body 22 includes a generally circular opening 26a through which conductors 12 may extend. In order to prevent abrasive engagement of the insulated conductors 12 with the metallic edge defining circular opening 26a, a plastic insulative throat 34 may be situated therein.

In conventional fashion conduit 10 is inserted into conduit connector 20 through conduit receiving end 24. Conduit 10 is inserted such that a forward edge 14b of outer jacket 14 abuts against insulative throat 34. Conductors 12 extending from conduit 10 extend through conductor egressing end 26 and through circular throat 34. Positioned in this manner, terminated end extent 15 of conduit 10 resides within passage 28 of body 22.

Figure 2:
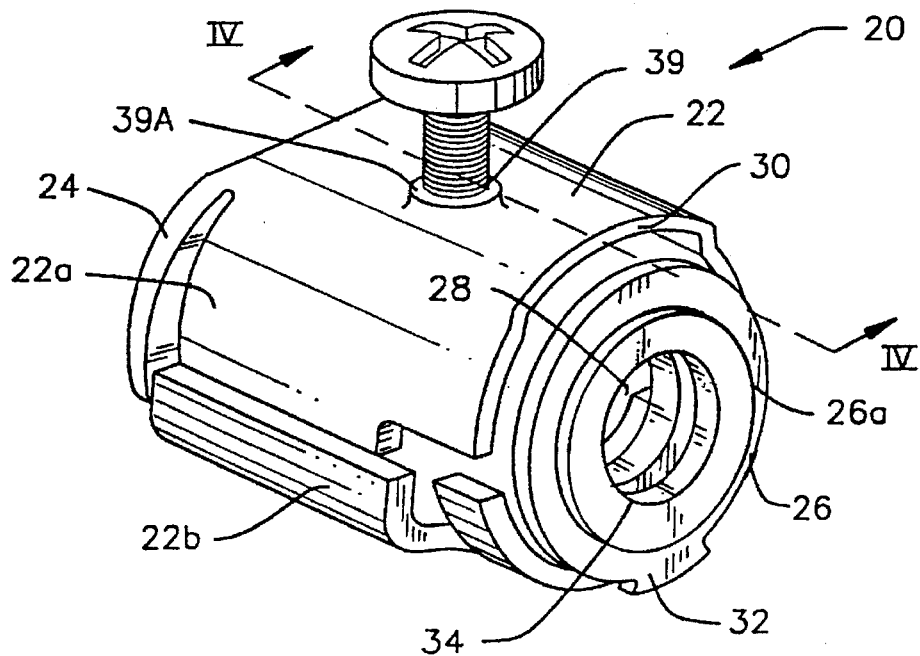
FIG. 2 is a perspective showing of an electrical conduit connector of the present invention.

Connector body 22 is formed from a flat metal blank which is stamped and formed into the configuration shown in FIG. 2. The resulting connector body 22 includes upper and lower relatively movable connector halves 22a and 22b which are movable in a clam-shell fashion about the pivot formed by conduit receiving end 24. The conductor egressing end 26 of body 22 includes raised upper and lower lips 30 and 32. In conventional fashion body 22 may be inserted into knockout opening 18a of junction box 18 (FIG. 1) by squeezing the upper and lower halves 22a and 22b of body 22 together. Once inserted within the opening, the body 22 may be radially expanded, in a manner which will be described in further detail hereinbelow so that the lips bear against the inside wall 18b of junction box 18 about knockout opening 18a so as to support conduit connector 20 within the opening.

Figure 3:
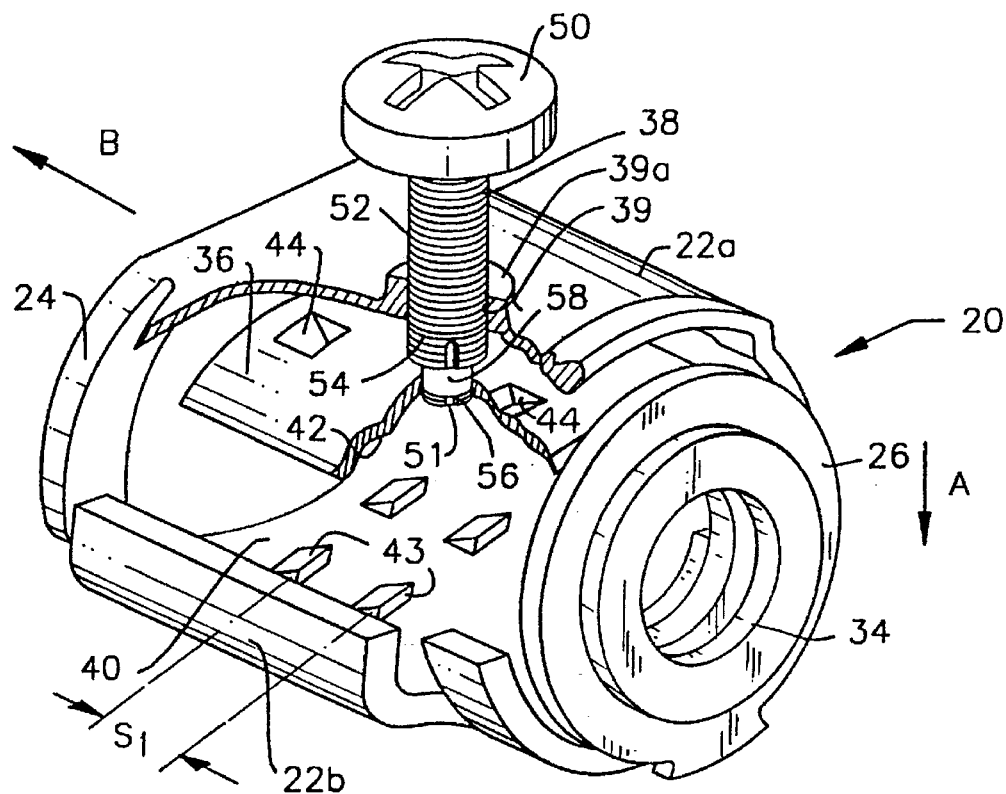
FIG. 3 is a perspective showing of the conduit connector of FIG. 2, in partial section, showing the interior of the connector.
Figure 4:
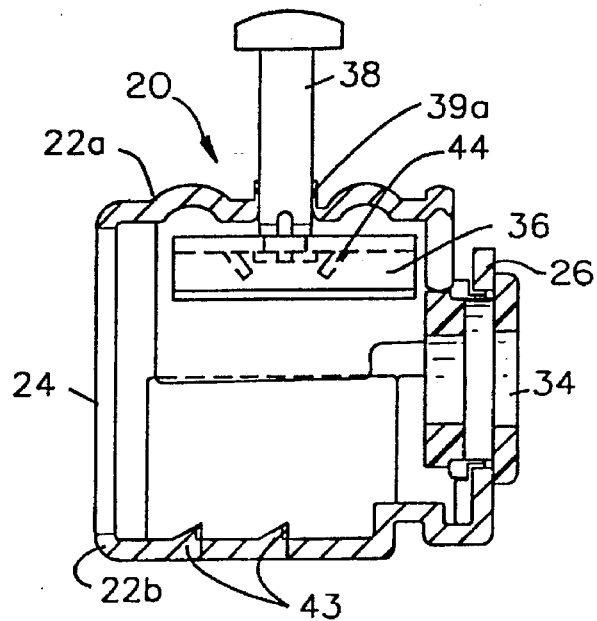
FIG. 4 is a vertical sectional showing of the connector of FIG. 2 taken generally through the lines IV—IV thereof.
Figure 5:
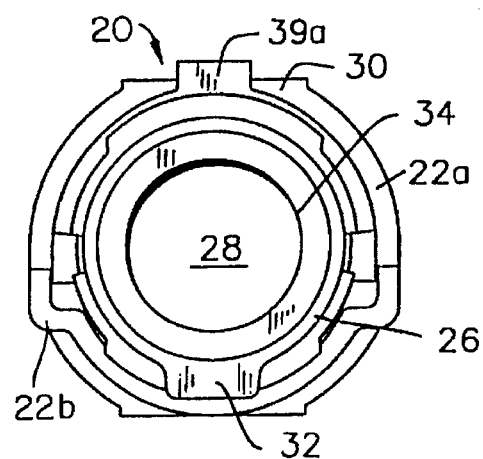
FIG. 5 is a front plan view of the connector of FIG. 2.

Referring to FIGS. 2–4, conduit connector 20 further includes a conduit engaging saddle 36 supported within passage 28 of connector body 22. Saddle 36 is an elongate member having a slight arcuate configuration which is engagable with outer jacket 14 (FIG. 1) of conduit 10 upon termination of conduit 10 within connector 20. Saddle 36 is supported to connector body 22 by an externally threaded screw 38 in a manner which will be described in further detail hereinbelow. Screw 38 extends through an aperture 39 which is centrally located through upper half 22a of body 22. A raised annular collar 39a of body 22 defines aperture 39. Saddle 36 is movable in the direction of arrow "A" (FIG. 3) by the actuation of screw 28 for movement into engagement with conduit 10 inserted within connector body 22.

In normal use, the conductor egressing end 26 of body 22 is inserted into the knockout opening 18a of junction box 18 (FIG. 1). The resilient action of the upper and lower halves 22a and 22b of body 22 permits the body to be inserted into the knockout opening 18a by compressing the halves together. The upper and lower lips 30 and 32 will spring back against the inner wall 18b of junction box 18 about knockout opening 18 to loosely support the conduit 10 and connector 20 within the opening of the junction box. In order to securely retain the connector 20 and conduit 10 within the opening 18a, screw 38 is tightened so that the saddle 36 becomes firmly engaged with the outer jacket 14 of conduit 10 supported therein. Continued screw tightening of screw 38 clamps the outer jacket 14 of conduit 10 between a lower interior surface 40 of body 22 and an inwardly-facing surface 42 of saddle 36. Further additional screw tightening of screw 38, with the conduit 10 clamped within the body 22, forces the upper and lower body halves 22a and 22b apart expanding conduit connector 20 to a point where upper and lower lips 30 and 32 are placed in tight firm engagement with the periphery of opening 18a of junction box 18. Thus, the tightening of screw 38 both secures the conduit 10 within the body 22 of connector 20 and secures the conduit connector 20 within the opening 18a of junction box 18.

In order to provide for increased resistance against axial pullout of conduit 10 from connector 20, the present invention provides a plurality of inwardly directed lances 43 extending from a lower interior surface 40 of body 22. Lances 43 are positioned in transverse and longitudinal spaced apart relationship and extend for engagement with the outer jacket 14 of conduit 10. Lances 43 are angled upwardly toward conductor engagement end 26 of body 22. The longitudinal spacing of lances 43 are such that they equal the spacing $S_1$ between the individual convolutions 14a of outer jacket 14 (FIG. 1). Further, the lances 43 extend outwardly from lower interior surface 40 a vertical distance which substantially equals the depth of the convolution 14a. Thus, the lances will have a tendency to reside between the convolutions 14a upon tightening of saddle 36 onto outer jacket 14. The lances 43 extended inwardly at an angle with respect to the longitudinal axis of connector 20 so that upon tightening of the saddle 36 the lances will have a tendency to ride over the raised rounded peaks of convolutions 14a and into the valleys between adjacent convolutions. The position and location of the lances 43 and their engagement with jacket 14 between convolutions 14a helps resist axial pullout (arrow "B") of conduit 10 from connector 20 once the connector and conduit are firmly attached to junction box 18.

In a similar fashion the inwardly-facing surface 42 of saddle 36 may also include a pair of longitudinally spaced lances 44 which are also spaced a distance apart which is a multiple of $S_1$ so that lances 44 will reside within valleys 14b the convolutions 14a of outer jacket 14. Lances 44 are provided for secondary axial securement of conduit 10. The primary resistance to axial pullout is provided by lances 43 of body 22. Thus, the directional orientation of lances 44 of saddle 36 is not as critical as that of lances 43. Accordingly, in the embodiment shown herein, the lances 44 extend in opposite mutually-facing directions. This allows the saddle 36 to be inserted into body 22 in either direction during manufacture. Also, lances 44 are staggered longitudinally with respect to lances 43 to provide engagement with the helically extending convolutions 14a.

A further feature of the present invention is shown particularly with respect to FIGS. 3 and 4. As mentioned above, the saddle 36 is attached to a distal end of screw 38. In prior art practices the saddle would be attached to screw 38 by swaging or staking the end of the screw to the saddle. Such securement technique would require access to the interior of the formed connector in order to assemble the saddle to the screw. Such assembly requirements complicate the manufacturing process making assembly of the connector more difficult and costly. The present invention provides a simplified method of securing screw 38 to saddle 36 by providing a specially manufactured screw design.

Screw 38 of the present invention is an elongate member having a head 50 at one end and an externally threaded shaft 52 extending therefrom. The shaft 52 includes an upper shaft section 54 adjacent head 50 and a lower shaft section 56 adjacent the distal end 51 of screw 38. The upper shaft section 54 includes external threads including a self-tapping thread at the end thereof which will tap through aperture 39 of body 22 of connector 20. The lower shaft section 56 has a diameter which is reduced from the diameter of upper shaft section 54 and also includes a self-tapping thread which is designed to thread through an aperture 36a in saddle 36. An unthreaded recessed section 58 of shaft 52 is provided between shaft sections 54 and 56. Unthreaded section 58 has a diameter less than that of lower shaft section 56 and is designed to capture and retain saddle 36 therein.

The screw and the saddle are attached to body 22 of connector 20 in the following manner. Appropriately sized drilled apertures 39 and 36a are placed respectively in body 22 and saddle 36. The saddle 36 is inserted into body 22 through conduit receiving end 24. The saddle 36 is held against the upper half 22a of body 22 by a mandrel (not shown) inserted therein. Apertures 39 and 36a are held in general alignment. Screw 38 is then driven into both components at the same time. The smaller diameter of lower shaft section 56 passes fully through aperture 39 of body 22 without interference. The self tapping threads on lower shaft section 56 then thread through aperture 36a of saddle 36 while at the same time the self-tapping threads of larger diameter upper shaft section 54 thread through aperture 39. Once the self tapping threads of lower shaft section 56 pass through aperture 36a, the saddle 36 will become captured within recessed section 58 between upper shaft section 54 and lower shaft section 56. As the diameter of upper shaft section 54 is significantly larger than the aperture 36a in saddle 36, the self-tapping thread on section 54 will not thread into aperture 36a. The saddle 36 has a thickness which is slightly smaller than the longitudinal extent of recessed section 58 so that the saddle is loosely captive between upper shaft section 54 and lower shaft section 56.

As may be appreciated, in order to effect assembly of saddle 36 to body 22, it is only necessary to hold saddle 36 adjacent the upper half 22a of body 22 during the tapping assembly. There is no need to insert swaging tools within the connector to swage the end of screw 38 to captivate saddle 36. Thus, assembly time and cost is greatly reduced.

Various changes to the foregoing described and shown structures would now be evident to those skilled in the art. Accordingly, the particularly disclosed scope of the invention is set forth in the following claims.

What is claimed:

1. A connection device for terminating electrical conduit having plural conductors therein to a knockout opening in an electrical junction box, said device comprising:

an elongate connector body formed from a single metal stamping and having a conduit receiving end, an opposed conductor egressing end and a central conduit passage therebetween for supporting an end extent of said conduit, said body including upper and lower connector halves relatively movable with respect to one another in clam-shell fashion about said conduit receiving end from a first position which allows said conductor egressing end to be inserted into said knockout opening and a second position which fixedly secures said conductor egressing end in said knockout opening of said electrical junction box;

opposed conduit engagement surfaces carried by said body which are relatively movable toward one another to engage said conduit end extent supported within said central conduit passage; and inwardly directed lances extending from one of said conduit engagement surfaces for engagement with said conduit end extent to frictionally retain said conduit end extent within said central conduit passage.

2. A device of claim 1 wherein said lances are positioned on said one conduit engagement surface as to allow said lances to reside between longitudinally spaced raised convolutions formed on an outer wall of said conduit as said engagement surfaces are moved toward one another.

3. A device of claim 2 wherein said one conduit engagement surface is formed as part of said body and the other conduit engagement surface is movably supported to said body in facing opposition to said one conduit engagement surface.

4. A device of claim 3 wherein said other conduit engagement surface includes a conduit saddle movably supported to said body, said saddle being movable towards said one conduit engagement surface.

5. A device of claim 4 wherein said conduit engagement surface of said saddle includes plural longitudinally spaced lances for engagement with said conduit.

6. A device of claim 2 wherein said lances of said one conduit engagement surface are spaced apart a distance which corresponds to the spacing of said longitudinally spaced raised convolutions.

7. A device of claim 5 wherein said lances of said conduit saddle are spaced apart a multiple of said given distance.

* * * * *